United States Patent
Ploss et al.

(10) Patent No.: US 11,251,269 B2
(45) Date of Patent: Feb. 15, 2022

(54) SEMICONDUCTOR DEVICE INCLUDING TRENCH GATE STRUCTURE AND MANUFACTURING METHOD

(71) Applicant: Infineon Technologies AG, Neubiberg (DE)

(72) Inventors: Reinhard Ploss, Unterhaching (DE); Thomas Aichinger, Faak am See (AT); Roland Rupp, Lauf (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 162 days.

(21) Appl. No.: 16/576,396

(22) Filed: Sep. 19, 2019

(65) Prior Publication Data

US 2020/0098868 A1    Mar. 26, 2020

(30) Foreign Application Priority Data

Sep. 20, 2018    (DE) .......................... 102018123164.4

(51) Int. Cl.
*H01L 29/10*    (2006.01)
*H01L 29/06*    (2006.01)
(Continued)

(52) U.S. Cl.
CPC ...... *H01L 29/1095* (2013.01); *H01L 29/0696* (2013.01); *H01L 29/1608* (2013.01); *H01L 29/4236* (2013.01); *H01L 29/66068* (2013.01)

(58) Field of Classification Search
CPC ............. H01L 29/1095; H01L 29/0696; H01L 29/1608; H01L 29/4236; H01L 29/66068
(Continued)

(56) References Cited

U.S. PATENT DOCUMENTS 9,773,883 B2 * 9/2017 Soeno ................. H01L 29/4236
2005/0012143 A1 * 1/2005 Tanaka .............. H01L 29/66068
257/328
(Continued)

FOREIGN PATENT DOCUMENTS

DE    102015212564 A1    1/2016

OTHER PUBLICATIONS

Ohoka, Atsushi, et al., "Reduction of RonA Retaining High Threshold Voltage in SiC DioMOS by Improved Channel Design", IEEE Proceedings of the 30th International Symposium on Power Semiconductor Devices & ICs, Chicago, USA, May 13-17, 2018, 52-55.

*Primary Examiner* — David Vu
*Assistant Examiner* — Brandon C Fox
(74) *Attorney, Agent, or Firm* — Murphy, Bilak & Homiller, PLLC

(57)    ABSTRACT

An embodiment of a semiconductor device includes a trench gate structure extending from a first surface into a silicon carbide semiconductor body along a vertical direction. A body region of a first conductivity type adjoins a sidewall of the trench gate structure and includes a first body sub-region adjoining the sidewall and a second body sub-region adjoining the sidewall. At least one profile of dopants of the first conductivity type along the vertical direction includes a first doping peak in the first body sub-region and a second doping peak in the second body sub-region. A doping concentration of the first doping peak is larger than a doping concentration of the second doping peak.

18 Claims, 7 Drawing Sheets

(51) Int. Cl.
*H01L 29/423* (2006.01)
*H01L 29/16* (2006.01)
*H01L 29/66* (2006.01)

(58) Field of Classification Search
USPC .......................................... 257/77, 330, 331
See application file for complete search history.

(56) References Cited

U.S. PATENT DOCUMENTS

| | | | |
|---|---|---|---|
| 2011/0201187 A1* | 8/2011 | Nishiwaki | H01L 29/7397 |
| | | | 438/529 |
| 2012/0248462 A1* | 10/2012 | Wada | H01L 29/7397 |
| | | | 257/77 |
| 2017/0221714 A1* | 8/2017 | Wakimoto | H01L 29/4236 |
| 2018/0308938 A1* | 10/2018 | Siemieniec | H01L 29/0623 |
| 2019/0181261 A1* | 6/2019 | Okumura | H01L 29/45 |

* cited by examiner

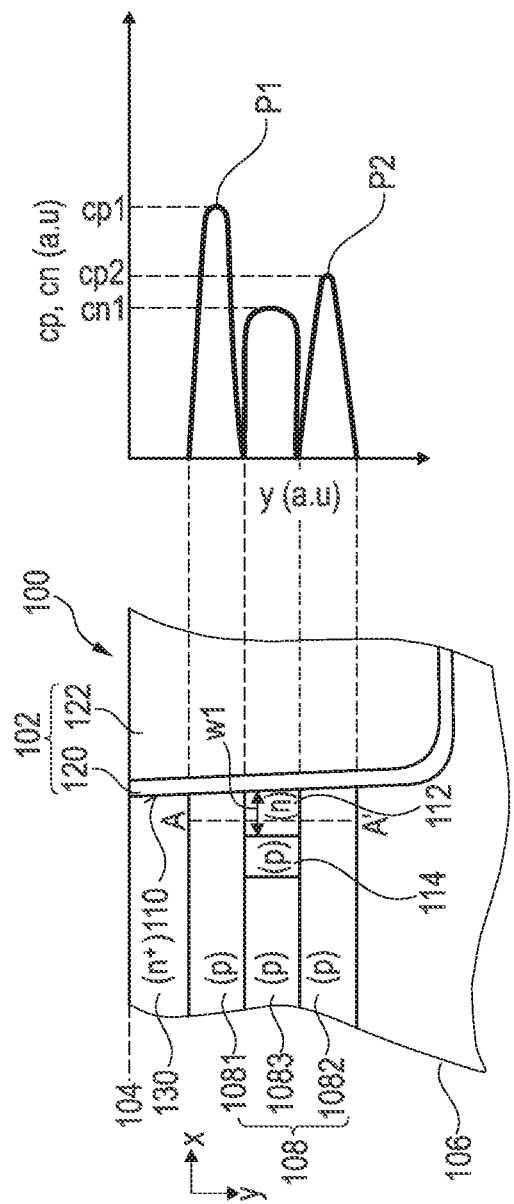
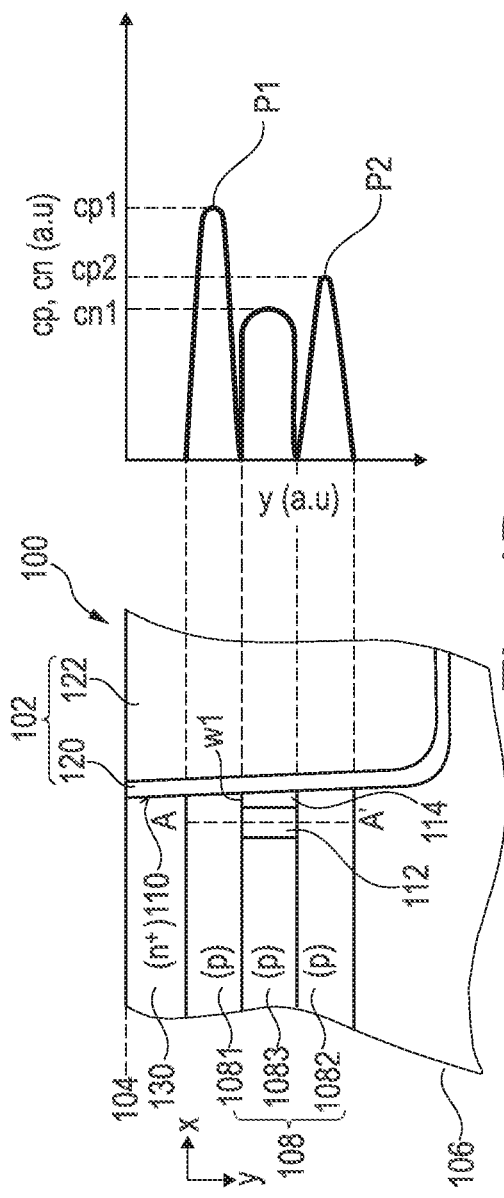

SEMICONDUCTOR DEVICE INCLUDING TRENCH GATE STRUCTURE AND MANUFACTURING METHOD

TECHNICAL FIELD

The present disclosure is related to semiconductor devices, in particular to silicon carbide (SiC) semiconductor devices and manufacturing methods therefor.

BACKGROUND

Technology development of SiC semiconductor devices including field effect transistor cells aims at reducing an area-specific on-state resistance $R_{DS(on)}$ without adversely affecting a blocking voltage capability $V_{DS}$ between source and drain. Although one device characteristic, for example the area-specific on-state resistance $R_{DS(on)}$, may be improved by varying a certain device parameter, for example by increasing a drift zone doping concentration, this may lead to deterioration of another device characteristic, for example the blocking voltage capability $V_{DS}$ between source and drain. Thus, device parameters are designed during technology development based on a number of tradeoffs to be met in view of target device specifications.

There is a need to improve semiconductor devices based on silicon carbide.

SUMMARY

An embodiment of the present disclosure relates to a semiconductor device that includes a trench gate structure extending from a first surface into a silicon carbide semiconductor body along a vertical direction. The semiconductor device further includes a body region of a first conductivity type adjoining a sidewall of the trench gate structure and including a first body sub-region adjoining the sidewall and a second body sub-region adjoining the sidewall. At least one profile of dopants of the first conductivity type along the vertical direction includes a first doping peak in the first body sub-region and a second doping peak in the second body sub-region. A doping concentration of the first doping peak is larger than a doping concentration of the second doping peak.

Another embodiment of the present disclosure relates to a method of manufacturing a semiconductor device. The method comprises forming a trench gate structure extending from a first surface into a silicon carbide semiconductor body along a vertical direction. The method further comprises forming a body region of a first conductivity type adjoining a sidewall of the trench gate structure and including a first body sub-region adjoining the sidewall and a second body sub-region adjoining the sidewall. At least one profile of dopants of the first conductivity type along the vertical direction includes a first doping peak in the first body sub-region and a second doping peak in the second body sub-region. A doping concentration of the first doping peak in the first body sub-region is larger than a doping concentration of the second doping peak in the second body sub-region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments of the semiconductor device and the method of manufacturing a semiconductor device, and together with the description serve to explain principles of the embodiments. Further embodiments and intended advantages will be readily appreciated as they become better understood by reference to the following detailed description. Further embodiments are described in the following detailed description and the claims.

FIGS. 4A and 4B are schematic cross-sectional views of embodiments of a semiconductor device including a p-doped compensation region forming a super-junction together with the first n-doped region.

DETAILED DESCRIPTION

Figure 1:
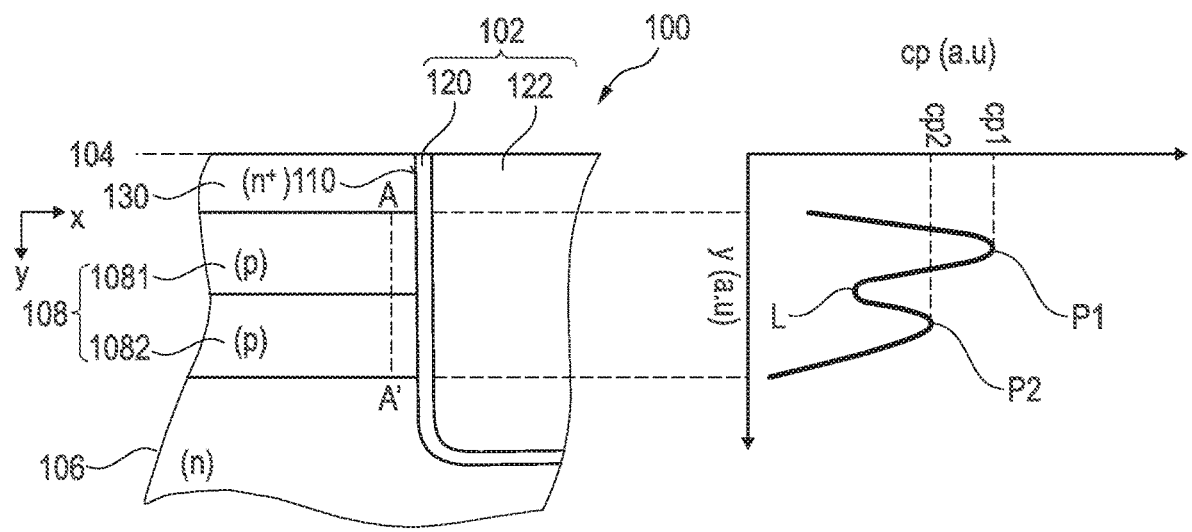
FIG. 1 illustrates a schematic cross-sectional view of an embodiment of a semiconductor device including first and second p-doped body sub-regions.

In the following detailed description, reference is made to the accompanying drawings, which form a part thereof and in which are shown by way of illustrations specific embodiments in which a semiconductor device may be practiced. It is to be understood that other embodiments may be utilized, and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise. If two components "adjoin" each other, they may either be in direct contact with each other (i.e., directly adjoin each other) at least in places or may be separated from each other by only a small distance. The small distance may be at most 100 nm, typically at most 20 nm or at most 10 nm.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two directly adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. A parameter y with a value of at least c reads as c≤y and a parameter y with a value of at most d reads as y≤d.

IGFETs (insulated gate field effect transistor) are voltage-controlled devices including MOSFETs (metal oxide semiconductor FETs) and other FETs with gate electrodes based on doped semiconductor material and/or with gate dielectrics that are not or not exclusively based on an oxide.

According to an embodiment a semiconductor device may include a trench gate structure extending from a first surface into a silicon carbide semiconductor body along a vertical direction. The semiconductor device may further include a body region of a first conductivity type adjoining a sidewall of the trench gate structure. The body region may include a first body sub-region adjoining the sidewall and a second body sub-region adjoining the sidewall. At least one profile of dopants of the first conductivity type along the vertical direction may include a first doping peak in the first body sub-region and a second doping peak in the second body sub-region. A doping concentration of the first doping peak may be larger than a doping concentration of the second doping peak.

The silicon carbide (SiC) semiconductor body may be from a hexagonal phase of silicon carbide, e.g., 4H-SiC. The silicon carbide semiconductor body may have an off-direction, for example in a <11-20> or a <1-100> direction. An off-axis angle of the silicon carbide semiconductor body may be in a range from 2° to 8°, typically 40. The first surface of the silicon carbide semiconductor body may be a main extension plane of the silicon carbide semiconductor body and is spanned by lateral directions.

The trench gate structure may include a gate dielectric and a gate electrode in a gate trench. The gate dielectric may include or consist of one layer or a combination of layers, e.g. a layer stack of dielectric layers, for example oxide layers such as thermal oxide layers or deposited oxide layers, e.g. tetraethyl orthosilicate (TEOS), undoped silicate glass (USG), phosphosilicate glass (PSG), boron silicate glass (BSP), borophosphosilicate glass (BPSG), nitride layers, high-k dielectric layers or low-k dielectric layers. A vertical extension of the trench gate structure may be in a range from 0.3 μm to 5 μm, e.g., in a range from 0.5 μm to 2 μm. Sidewalls of the gate trench may be perpendicular to the first surface or may taper with increasing distance to the first surface. A lateral width of the trench gate structures may be in a range from 500 nm to 5 μm, e.g., in a range from 1 μm to 3 μm.

The gate electrode may include or consist of one electrode material or a combination of electrode materials, for example a doped semiconductor material (e.g., a degenerate doped semiconductor material) such as doped polycrystalline silicon, metal or metal compounds.

The first body sub-region may be positioned above the second body sub-region in the vertical direction or vice versa. The first body sub-region may be spaced from the second body sub-region in the vertical direction.

The at least one profile of dopants may be spaced from the sidewall by a lateral distance. The lateral distance may be in a range from a few nanometers (e.g., in a range from 1 nm to 10 nm) up to half of a mesa width (e.g., in a range from 100 nm to 1.5 μm or 1.3 μm), for example. The mesa width may correspond to a width of a mesa region defined by the semiconductor body between neighboring trench gate structures, for example. The lateral distance may refer to or be measured with respect to a depth in the semiconductor body where the gate electrode is present, e.g. a depth at a level along a direction perpendicular to the first surface falling within an extension of the gate electrode perpendicular to the first surface, for example. In other embodiments, the profile of dopants, the first doping peak and/or the second doping peak may directly adjoin the sidewall of the trench gate structure.

The at least one profile of dopants of the first conductivity type may include one or more dopant species of the first conductivity type, e.g. one or more of dopant elements such as phosphorus (P) and nitrogen (N) and other suitable elements or complexes for n-type doping or one or more of dopant elements such as boron (B), gallium (Ga) and aluminum (Al) and other suitable elements or complexes for p-type doping. The term "dopant species" denotes a specific dopant element, e.g. P for n-type doping or B for p-type doping in SiC. For example, the dopants may be introduced into the silicon carbide semiconductor body by means of ion implantation and/or during epitaxial growth.

The number of dopant species, i.e. the number of different dopant elements, and/or the composition of dopants species, i.e. the respective ratio of different dopant elements, may vary along the at least one profile of dopants. The doping concentration at a specific depth of the profile of dopants corresponds to a sum of the doping concentrations of the different dopant species in case of two or more dopant species of the first conductivity type being present the specific depth (so-called effective doping concentration). According to an embodiment, a number and/or type and/or composition of dopant species may vary with respect to the first body sub-region and the second body sub-region, for example. According to another embodiment, the first and second body sub-regions may comprise the same dopant species, in particular the same composition of dopant species and/or the same number of dopant species.

The terms "first doping peak" and "second doping peak" refer to peaks in the profile of dopants of the first conductivity type along the vertical direction, i.e. a concentration of dopants of the first conductivity type around the first (second) peak increases along the vertical direction up to the first (second) peak and then starts to decrease from a peak concentration. In general, a "doping peak" may be a maximum, for instance in the form of a local or global maximum or a plateau, of the doping concentration in a profile of dopants. Two doping peaks of the first conductivity type may, for example, be separated by at least one of: a minimum in the profile of dopants of the first conductivity type, a lower maximum in the profile of dopants of the first conductivity type, a lower plateau in the profile of dopants of the first conductivity type, a region of a second conductivity type opposite the first conductivity type, or an undoped region.

A doping concentration of the first doping peak may be adjusted depending on a desired threshold voltage $V_{th}$ of the semiconductor device. A doping concentration of the second doping peak and/or in the second body sub-region may be smaller than a doping concentration of the first doping peak and/or in the first body sub-region, respectively. For example, the second body sub-region may be adjusted to avoid enhancement of drain-induced barrier lowering (DIBL). A part of a channel region between the first doping peak and/or the first body sub-region and the second doping peak and/or the second body sub-region, respectively, may enable a reduction of a channel resistance, thus allowing for a reduction of the area-specific on-state resistance $R_{DS(on)}$.

The channel region is the part of the semiconductor device that comprises the channel. The channel region comprises at least one doping region. Depending on the embodiment of the semiconductor device, the channel region may comprise the body region and, if applicable, further regions (e.g., a first region, a second region, a third region and/or a compensation region) adjoining the sidewall and being at least partly surrounded by the body region.

According to an embodiment of the semiconductor device, the body region may further comprise a third body sub-region between the first body sub-region and the second body sub-region. At least one profile of dopants of the first conductivity type along the vertical direction may include a third doping peak in the third body sub-region. A doping concentration of the third doping peak may be smaller than the doping concentration of the first doping peak and may also be smaller than the doping concentration of the second doping peak. This may allow for increasing a charge inversion condition of a MOSFET channel in the third body sub-region compared with the first body sub-region, for example. Thereby, a decrease of the area-specific on-state resistance $R_{DS(on)}$ may be achieved.

According to an embodiment of the semiconductor device, the body region may further comprise a third body sub-region between the first body sub-region and the second body sub-region. At least one profile of dopants of the first conductivity type along the vertical direction may include a doping valley in the third body sub-region. The doping valley may be a non-vanishing minimum, for instance in the form of a local or global minimum or a plateau, of the doping concentration in the profile of dopants. The doping valley may be caused by an overlap of a doping profile tail of the first doping peak and a doping profile tail of the second doping peak or by one or several doping peaks with overlapping tail regions exhibiting a lower doping concentration in relation to the first doping peak, for example. This may allow for increasing a charge inversion condition of a MOSFET channel in the third body sub-region compared with the first body sub-region, for example. Thereby, a decrease of the area-specific on-state resistance $R_{DS(on)}$ may be achieved.

According to an embodiment of the semiconductor device, the third body sub-region may adjoin the sidewall of the trench gate structure. Thus, a part of an MOSFET inversion channel may be formed in the third body sub-region and the third body sub-region may enable a reduction of area-specific on-state resistance $R_{DS(on)}$ as described above.

According to an embodiment, the third body sub-region may comprise dopants of the first conductivity type and dopants of a second conductivity type. The second conductivity type is opposite to the first conductivity type. A concentration of the dopants of the first conductivity type may exceed a concentration of the second conductivity type in at least part of the third body sub-region. The dopants of the second conductivity type may partially compensate the dopants of the first conductivity type. The partial compensation may range between 10% to 95% in at least part of the third body sub-region or even in the entire third body sub-region. By way of example, the first conductivity type may be a p-type and the second conductivity type may be an n-type or vice versa. When forming the first to third body sub-regions, the doping concentrations in these sub-regions may differ from final doping concentrations as described above. This may be due to a subsequent compensation doping of the second conductivity type introduced into the third body sub-region, for example.

According to an embodiment the semiconductor device may further comprise a first region of a second conductivity type opposite the first conductivity type between the first body sub-region and the second body sub-region. The first region may adjoin at least one of the first body sub-region and the second body sub-region. In some embodiments, the first region directly adjoins only one of the first body sub-region and the second body sub-region. By way of example, the first body sub-region and the first region may form a first pn junction, and the first region and a fifth body sub-region of the first conductivity type may form a second pn junction, the fifth body sub-region being arranged between the first region and the second body sub-region. By way of yet another example, a sixth body sub-region and the first region may form a first pn junction, and the first region and the second body sub-region form a second pn junction, the sixth body sub-region being arranged between the first region and the first body sub-region. The first region may act as a conductive channel bypass enabling a reduction of the area-specific on-state resistance $R_{DS(on)}$. A current flow in the first region during an on-state of the semiconductor device may occur at a greater lateral distance from an interface between a gate dielectric and the semiconductor body than an inversion channel current flowing in the first and/or second body sub-regions This may reduce a negative impact of channel current flow on the reliability of the gate dielectric, for example.

According to an embodiment the first region may adjoin the sidewall of the trench gate structure. Thus, the first region may interconnect inversion channel parts of the first and second body sub-regions, for example.

According to an embodiment of the semiconductor device, the first region may be arranged at a lateral distance from the sidewall of the trench gate structure. The body region may comprise a fourth body sub-region arranged between the first region and the sidewall.

According to an embodiment of the semiconductor device, a dimension of the first region along a lateral direction may range from 20 nm to 200 nm, or from 50 nm to 150 nm. By increasing a lateral dimension of the first region compared with a lateral dimension of an inversion channel, a further reduction of the area-specific on-state resistance $R_{DS(on)}$ may be achieved.

According to an embodiment of the semiconductor device, a doping concentration of the first region averaged along the lateral direction may range from $5\times10^{15}$ cm$^{-3}$ to $2\times10^{17}$ cm$^{-3}$, or from $1\times10^{16}$ cm$^{-3}$ to $1\times10^{17}$ cm$^{-3}$. When adjusting the doping concentration of the first region, a doping concentration of the first doping peak, a gate oxide thickness and a trade-off between the doping concentration in the first region and DIBL may be taken into account. This may allow for a further reduction of the area-specific on-state resistance $R_{DS(on)}$.

According to an embodiment the semiconductor device may further comprise a compensation region of the first conductivity type. Along the lateral direction, the first region may be arranged between the sidewall and the compensation region or the compensation region may be arranged between the sidewall and the first region. The first region and the compensation region may adjoin each other. The first region and the compensation region may form a super-junction structure. This may allow for an increase of a doping concentration in the first region based on a charge compensation principle of a super-junction, thereby enabling a further decrease in the area-specific on-state resistance $R_{DS(on)}$.

According to an embodiment of the semiconductor device, a doping concentration $c_{cav}$ of the compensation region averaged along a lateral dimension $l_c$ in the lateral direction times the lateral dimension $l_c$ may differ by at most ±20% from a doping concentration $c_{1av}$ of the first region averaged along a lateral dimension $l_1$ in the lateral direction (x) times the lateral dimension $l_1$, i.e., $0.8\times l_c\times c_{cav}<l_1\times c_{1av}<1.2\times l_c\times c_{cav}$.

This may allow for a charge compensation between the first region and the charge compensation region that may enable a further decrease in the area-specific on-state resistance $R_{DS(on)}$.

According to an embodiment of the semiconductor device, the compensation region may be arranged between the sidewall and the first region. The semiconductor device may further comprise at least one of i) a second region of the second conductivity type arranged between the first region and the sidewall, wherein the second region may adjoin the sidewall and may further adjoin the first body sub-region, and a vertical dimension of the second region may be smaller than a vertical dimension of the first region, and ii) a third region of the second conductivity type arranged between the first region and the sidewall, wherein the third region may adjoin the sidewall and may further adjoin the second body sub-region, and a vertical dimension of the third region may be smaller than a vertical dimension of the first region. The at least one of the second region and the third region may improve an electric interconnection between the first region and an inversion channel in the first and/or second body sub-region and may thus enable a further decrease in the area-specific on-state resistance $R_{DS(on)}$.

According to an embodiment of the semiconductor device, the trench gate structure may comprise a gate dielectric and a gate electrode, and a material of the gate electrode may be at least one of highly p-doped polycrystalline silicon, nickel, platinum, gold, or selenium. Other materials for the gate electrode may be used provided that a work function of the material ranges from 4 eV to 6.5 eV, or from 4.5 eV to 6 eV. These materials may allow for threshold voltages that are large enough to avoid re-turn-on effects of the semiconductor device, for example.

According to an embodiment the semiconductor device may further comprise a shielding region of the first conductivity type adjoining at least part of a bottom of the trench gate structure. The shielding region may protect the gate dielectric from high electric field strengths occurring during a reverse voltage mode of the semiconductor device, for example. The shielding region may also adjoin a sidewall of the trench gate structure. The shielding region and the body region may adjoin the trench gate structure from opposite sidewalls, for example. The body region may also adjoin the trench gate structure from opposite sidewalls of the trench gate structure and the shielding region may adjoin the trench gate structure at a bottom of the trench gate structure, for example.

According to an embodiment of the semiconductor device, the body region may adjoin a second sidewall of the trench gate structure opposite to the sidewall. Thus, a channel region may be formed at both sidewalls of the trench gate structure, for example.

According to an embodiment of the semiconductor device, the body region may adjoin only one sidewall of opposite two sidewalls of the trench gate structure. Thus, a channel region may be formed at only one of the opposite two sidewalls of the trench gate structure. By way of example, a shielding region and the body region may adjoin the trench gate structure from opposite sidewalls of the trench, for example.

According to an embodiment of a method of manufacturing a silicon carbide semiconductor device, the method may comprise forming a trench gate structure extending from a first surface into a silicon carbide semiconductor body along a vertical direction. The method may further comprise forming a body region of a first conductivity type adjoining a sidewall of the trench gate structure and including a first body sub-region adjoining the sidewall and a second body sub-region adjoining the sidewall. At least one profile of dopants of the first conductivity type along the vertical direction may include a first doping peak in the first body sub-region and a second doping peak in the second body sub-region. A doping concentration of the first doping peak in the first body sub-region may be larger than a doping concentration of the second doping peak in the second body sub-region.

The method may be applied for manufacturing the semiconductor device as described with respect to any of the above embodiments or any of the embodiments described below in connection with the figures. In at least some embodiments of the method, the following features (if applicable) apply, alone or in combination:

(i) forming at least one of the body region, the first body sub-region, the second body sub-region, the third body sub-region, the shielding region, the first region, the second region, the third region, the compensation region may include at least one masked or unmasked ion implantation process;

(ii) forming the first body sub-region includes one, two, three, four or even more ion implantation processes at different implantation energy;

(iii) forming the second body sub-region includes one, two, three, four or even more ion implantation processes at different implantation energy;

(iv) forming the trench gate structure includes forming a gate trench in the SiC semiconductor body at the first surface, forming a gate dielectric in the gate trench and forming a gate electrode in the gate trench;

(v) forming the first region includes introducing dopants through a sidewall of the gate trench into the SiC semiconductor body by one or more ion implantation processes;

(vi) forming the first region includes introducing dopants through the first surface into the SiC semiconductor body by one or more ion implantation processes;

(vii) forming the shielding region comprises introducing dopants through a bottom of the gate trench into the SiC semiconductor body by one or more ion implantation processes;

(viii) forming the shielding region comprises introducing dopants through the first surface into the SiC semiconductor body by one or more ion implantation processes.

It will be appreciated that while the method is described above and below as a series of steps or events, the described ordering of such steps or events are not to be interpreted in a limiting sense. Rather, some steps may occur in different orders and/or concurrently with other steps or events apart from those described above and below. For example, in some embodiments the trench gate structure may be formed after forming the body region.

Figure 5:
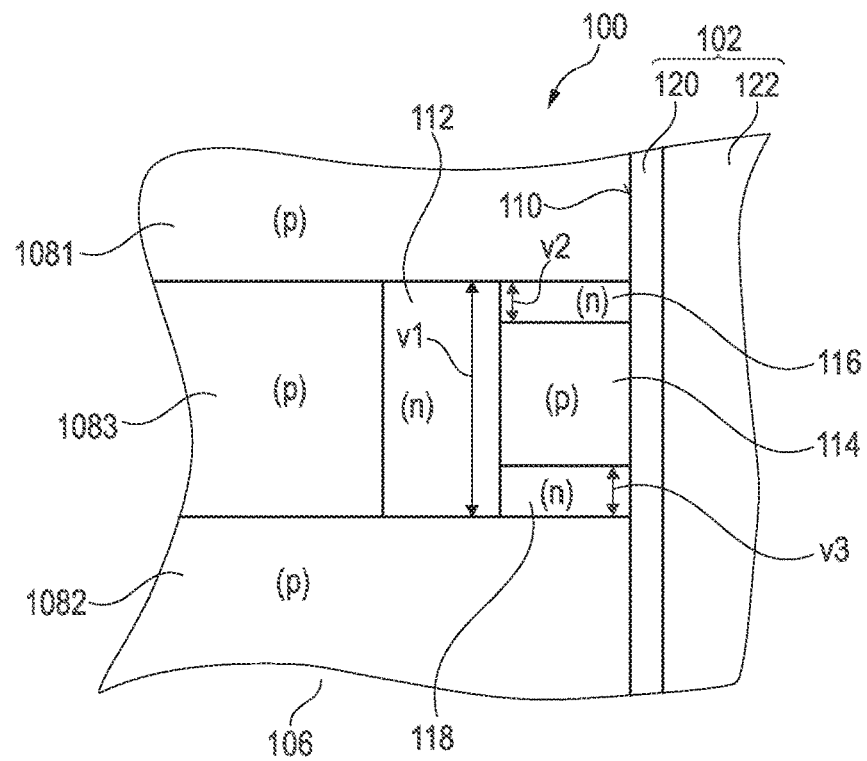
FIG. 5 is a schematic cross-sectional view of an embodiment of a semiconductor device including the first n-doped region and second and third n-doped regions for electrically connecting the first n-doped region to an inversion channel during an on-state of the semiconductor device.
Figure 6A:
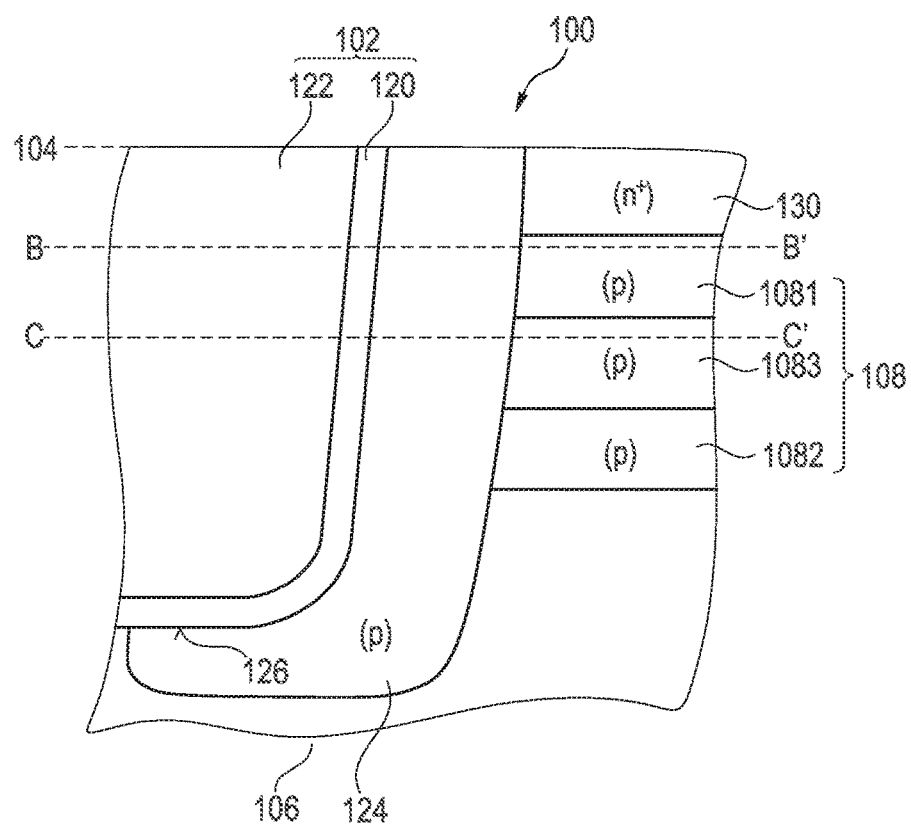
FIGS. 6A and 6B are schematic cross-sectional views of embodiments of a semiconductor device including a shielding region adjoining a bottom of the trench gate structure.
Figure 6B:
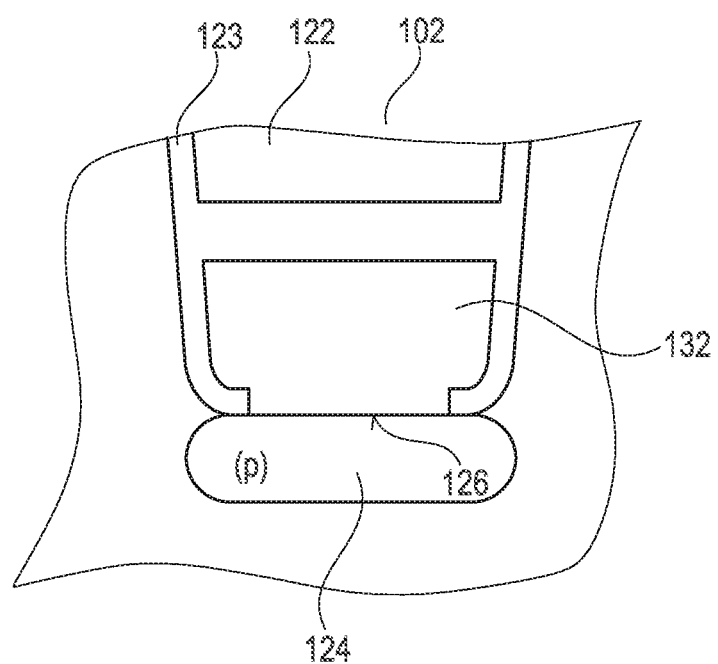

The embodiments described above will be further illustrated with respect to exemplary figures described below. Each of FIGS. 1 to 4B shows a schematic cross-sectional view of a section of an exemplary embodiment of a semiconductor device on the left-hand side and a corresponding concentration of p-type dopants cp and/or n-type dopants cn as a function of the vertical direction y on the right-hand side. FIGS. 5, 6A and 6B show a schematic cross-sectional view of a section of an exemplary embodiment of a semiconductor device. As a mere example, an n-type channel semiconductor device is shown in the figures. However, the person skilled in the art will appreciate that certain concepts described in connection with the figures are also applicable to a p-type channel semiconductor device.

Referring to the schematic cross-sectional view of FIG. 1, an embodiment of a semiconductor device 100 includes a trench gate structure 102 extending from a first surface 104 into a silicon carbide semiconductor body 106 along a vertical direction y. The trench gate structure 102 includes a gate dielectric 120 and a gate electrode 122. A p-doped body region 108 adjoins a sidewall 110 of the trench gate structure 102 and includes a first body sub-region 1081 adjoining the sidewall 110 and a second body sub-region 1082 adjoining the sidewall 110. An n$^+$-doped source region 130 is arranged between the first surface 104 and the body region 108 and further adjoins the sidewall 110. At least one profile of p-type dopants along the vertical direction y includes a first doping peak P1 in the first body sub-region 1081 and a second doping peak P2 in the second body sub-region 1082. A doping concentration cp1 of the first doping peak P1 is larger than a doping concentration of the second doping peak P2. The doping profile illustrated in FIG. 1 is taken along a line AA'. In the exemplary embodiment illustrated in FIG. 1, a doping valley V coincides with an interface between the first body sub-region 1081 and the second body sub-region 1082. The doping type of the regions illustrated in FIG. 1 and the other figures described herein may be inverted, i.e. p-type becomes n-type and n-type becomes p-type.

Functional and structural details described with respect to the embodiments above shall likewise apply to the exemplary embodiments illustrated in the figures and described below.

Figure 2A:
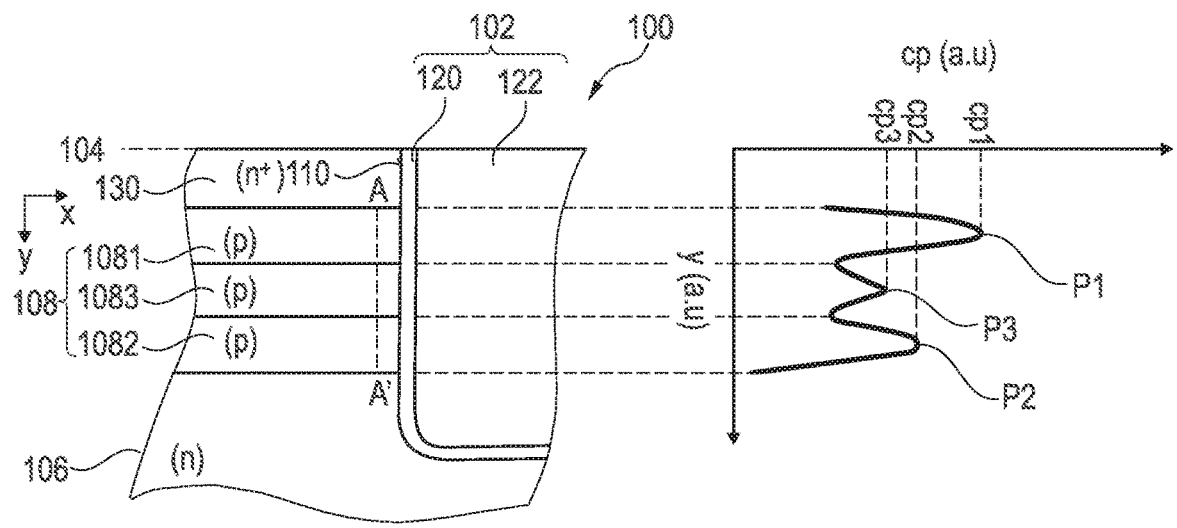
FIGS. 2A and 2B illustrate schematic cross-sectional views of embodiments of a semiconductor device including a third p-doped body sub-region.

Referring to the schematic cross-sectional view of FIG. 2A, in an embodiment of the semiconductor device 100, the body region 108 further includes a third body sub-region 1083 between the first body sub-region 1081 and the second body sub-region 1082. At least one profile of p-type dopants along the vertical direction y includes a third doping peak P3 in the third body sub-region 1083. A doping concentration cp3 of the third doping peak P3 is smaller than the doping concentration cp1 of the first doping peak P1 and is also smaller than the doping concentration cp2 of the second doping peak P2.

Figure 2B:
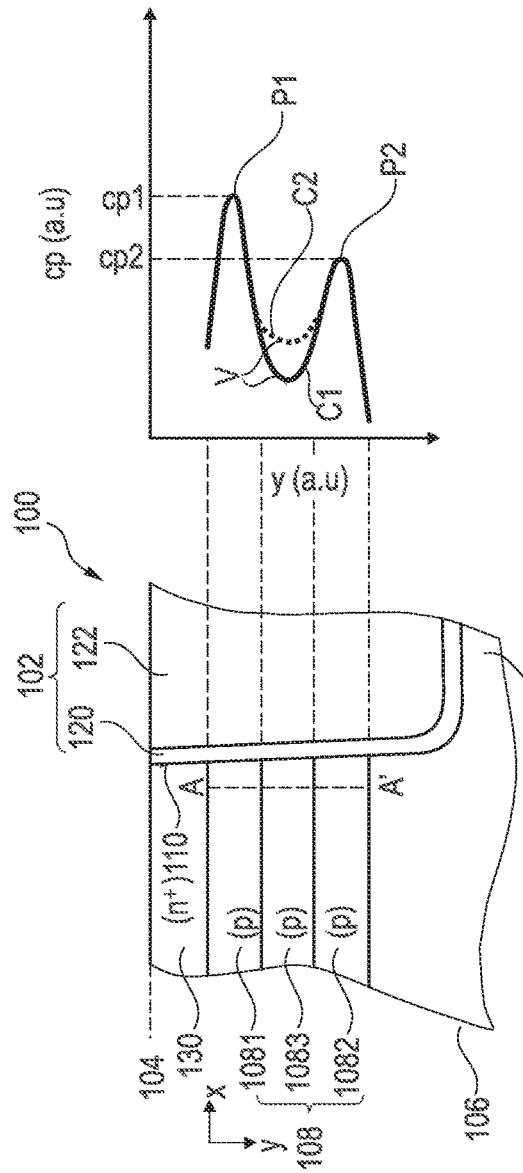

Referring to the schematic cross-sectional view of FIG. 2B, in an embodiment of the semiconductor device 100, at least one profile of p-type dopants of the first conductivity type along the vertical direction includes a doping valley V in the third body sub-region 1083. The doping valley V may be caused by an overlap of a doping profile tail of the first doping peak P1 and a doping profile tail of the second doping peak P2, for example (see illustrated profile c1 in FIB. 2B). The doping valley may also be caused by a body region background doping, for example (see illustrated profile c2 in FIB. 2B).

In the illustrated embodiments, a partial compensation of p-type dopants by n-type dopants may range between 10% to 95%, e.g. 50%, in at least part of the third body sub-region 1083, for example. The third body sub-region may adjoin the sidewall 110 of the trench gate structure 102.

Figure 3:
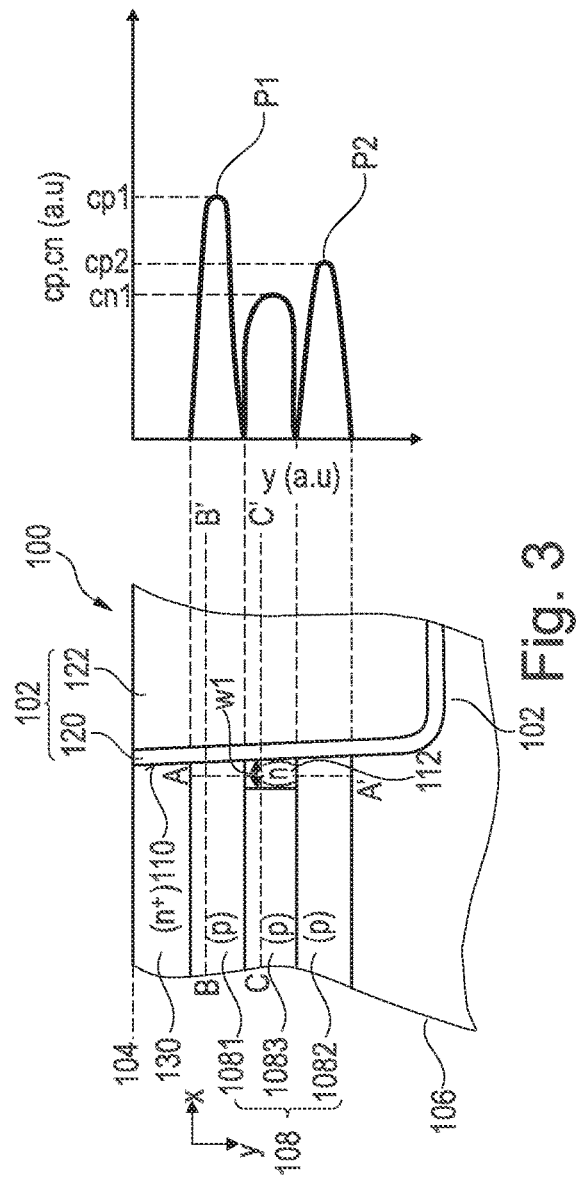
FIG. 3 is a schematic cross-sectional view of an embodiment of a semiconductor device including a first n-doped region between the first and second body sub-regions.

Referring to the schematic cross-sectional view of FIG. 3, an embodiment of a semiconductor device 100 includes a first n-doped region 112 between the first body sub-region 1081 and the second body sub-region 1082. The first region 112 adjoins the first body sub-region 1081 and further adjoins the second body sub-region 1082. The first region 112 adjoins the sidewall 110 of the trench gate structure 102. Thus, the first region 112 may interconnect inversion channel parts of the first and second body sub-regions 1081, 1082 by a low-ohmic bypass, for example.

According to an embodiment of the semiconductor device, a dimension w1 of the first region 112 along a lateral direction x perpendicular to the vertical direction y may range from 20 nm to 200 nm, or from 50 nm to 150 nm. By increasing the lateral dimension w1 of the first region 112 compared with a lateral dimension of an inversion channel, a further reduction of the area-specific on-state resistance $R_{DS(on)}$ may be achieved. A doping concentration of the first region 112 averaged along the lateral direction x may range from $5 \times 10^{15}$ cm$^{-3}$ to $2 \times 10$ cm$^{-3}$, or from $1 \times 10^{16}$ cm$^{-3}$ to $1 \times 10^{17}$ cm$^{-3}$. When adjusting the doping concentration of the first region 112, a doping concentration of the first doping peak P1, a gate oxide thickness and a trade-off between the doping concentration in the first region 112 and DIBL may be taken into account. This may allow for a further reduction of the area-specific on-state resistance $R_{DS(on)}$. A maximum n-type doping concentration cn1 in the first region 112 along the line AA' may be smaller than the peak concentrations cp1, cp2 in the first and second body sub-regions 1081, 1082 as illustrated in FIG. 3. According to other embodiments, the relation cp2<cn1<cp1 or cn1>cp1 and cn1>cp2 may hold.

Referring to the schematic cross-sectional view of FIGS. 4A and 4B, embodiments of the semiconductor device 100 further include a p-doped compensation region 114. Along the lateral direction x, the first region 112 may be arranged between the sidewall 110 and the compensation region 114 (see embodiment illustrated in FIG. 4A) or the compensation region 114 may be arranged between the sidewall 110 and the first region 112 (see embodiment illustrated in FIG. 4B). The first region 112 and the compensation region 114 adjoin each other. The first region 112 and the compensation 112 region form a super-junction structure. This may allow for an increase of a doping concentration in the first region 112 based on a charge compensation principle of a super-junction, thereby enabling a further decrease in the area-specific on-state resistance $R_{DS(on)}$.

Referring to the schematic cross-sectional view of FIG. 5, an embodiment of the semiconductor device 100 further includes a second n-doped region 116 between the first region 112 and the sidewall 110. The second region 116 adjoins the sidewall 110 and the first body sub-region 1081. A vertical dimension v2 of the second region 116 is smaller than a vertical dimension v1 of the first region 112. The semiconductor device 100 further includes a third n-doped region 118 arranged between the first region 112 and the sidewall 110. The third region 118 adjoins the sidewall 110 and further adjoins the second body sub-region 1082. A vertical dimension v3 of the third region 118 is smaller than the vertical dimension v1 of the first region 112. Each of the second region 116 and the third region 118 may improve an electric interconnection between the first region 112 and an inversion channel in the first and/or second body sub-region 1081, 1082, and may thus enable a further decrease in the area-specific on-state resistance $R_{DS(on)}$.

Referring to the schematic cross-sectional view of FIG. 6A, an embodiment of the semiconductor device 100 further includes a p-doped shielding region 124 adjoining at least part of a bottom 126 of the trench gate structure 102. The shielding region 124 may protect the gate dielectric 120 from high electric field strengths that may occur during a reverse voltage mode of the semiconductor device 100, for example. The shielding region 124 illustrated in the embodiment of FIG. 6A may be electrically connected at the first surface 104.

According to the embodiment of the semiconductor 100 illustrated in the schematic cross-sectional view of FIG. 6B, the p-doped shielding region 124 adjoins a bottom of the trench gate structure 102. The shielding structure 124 is electrically connected to an electrode 124 at the bottom of the trench structure 102. The electrode may be raised up to the first surface 104 at a connection area, for example at an edge of a transistor cell area. The electrode 124 and the gate electrode 122 are electrically insulated by a dielectric structure 123 that includes the gate dielectric 120.

Figure 7A:
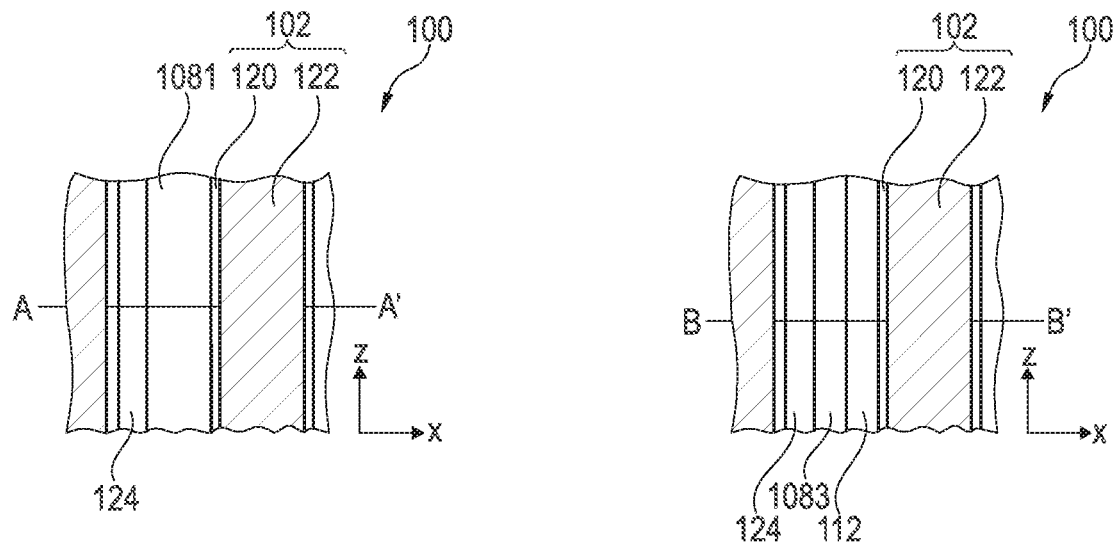
FIGS. 7A, 7B and 7C show schematic plan views of embodiments of a semiconductor device.
Figure 7B:
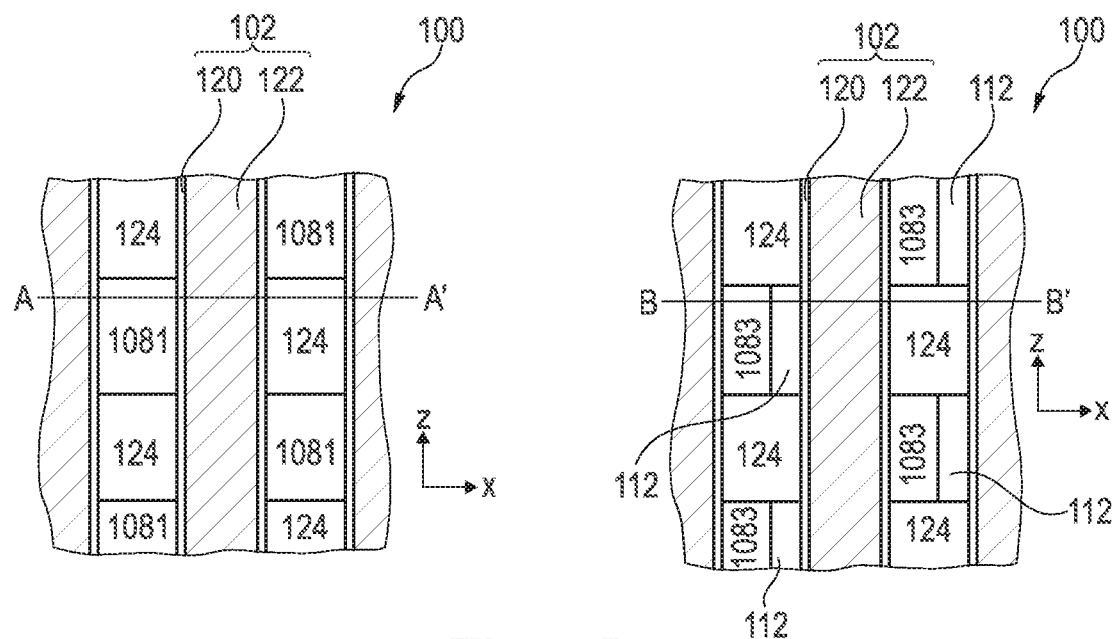
Figure 7C:
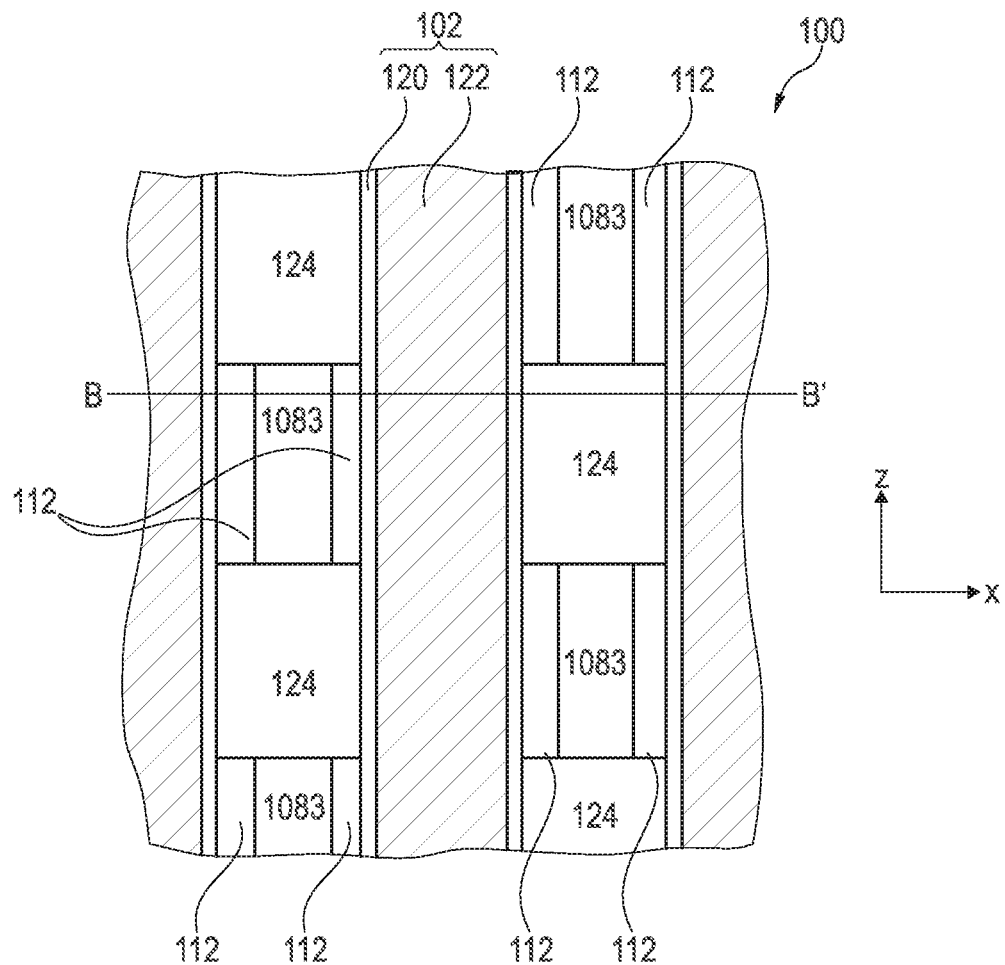

With reference to the respective plan views depicted in FIGS. 7A, 7B and 7C, embodiments of a semiconductor device 100 are described in more detail. FIGS. 7A to 7C show plan views of a cut along a plane spanned by the lateral directions x, z (z also being referred to as the "longitudinal direction" below). Each of FIGS. 7A and 7B shows two plan views at two respective vertical positions, while FIG. 7C only shows one plan view at one vertical position. In particular, on the left hand side of each of FIGS. 7A and 7B, a cut along an upper position A-A' is shown, whereas on the right hand side of each of FIGS. 7A and 7B as well as in FIG. 7C, a cut along a lower vertical position B-B' is shown.

The corresponding cross-sectional views of the embodiments shown in FIGS. 7A to 7C may, in each case, be the cross-sectional view shown in FIG. 3 in connection with the embodiment depicted in FIG. 6A. That is to say, in the depicted examples, the channel region comprises at least the body region with a first body sub-region 1081 and a third body sub-region 1083, as well as a first region 112. The person skilled in the art will, however, appreciate that features disclosed with respect to the plan views shown in FIGS. 7A to 7C are also applicable to other cross-sectional views and/or other embodiments of the semiconductor device 100. In at least one of these embodiments, the channel region of the semiconductor device 100 comprises a body region (with, e.g., a first, second and/or third body sub-region) and, optionally, further regions (e.g. the first region, the second region, the third region and/or the compensation region).

In each of the embodiments shown in FIGS. 7A to 7C, the trench gate structure 102 is stripe shaped. That is to say, the trench gate structure 102 extends mainly along a longitudinal or lateral direction z and a lateral width of the trench gate structure 102 perpendicular to the longitudinal direction z is small compared to a length of the trench gate structure 102 along the longitudinal direction z.

In other embodiments (not shown in the Figures), the trench gate structure 102 may be of a circular, a hexagonal or a square shape. The lateral width may then approximately correspond to the length of the trench gate structure 102. The channel region and/or the body region may adjoin more than one sidewall or even more than two sidewalls of the trench gate structure.

In the embodiment shown in FIG. 7A, the channel region extends along a majority (e.g., at least 60% or at least 80%) of the trench gate structure 102 in the longitudinal direction z. In particular, each of the first body sub-region 1081, the third body sub-region 1083, and the first region 112 extend along a majority of the trench gate structure 102 in the longitudinal direction z. A doped shielding region 124 adjoins an opposite sidewall of the trench gate structure 102 that is free of the channel region. Different to the embodiment shown in FIG. 7A, the sidewalls of the trench gate structure 102 may, however, be free of a doped shielding region 124. The doped shielding region 124 may then, for example, adjoin only the bottom of the trench gate structure 102 (similar to the embodiment shown in FIG. 6B).

In the embodiments shown in FIGS. 7B and 7C, a plurality of channel regions adjoin the trench gate structure 102 (e.g., a plurality of first body sub-regions 1081, a plurality of second body sub-regions 1083 and/or a plurality of first regions 112) adjoin the trench gate structure 102, wherein all channel regions combined extend along at most 70% or at most 60% and of the trench gate structure 102 in the longitudinal direction z. The combined channel regions may further extend along at least 30% or at most 40% of the trench gate structure 102 in the longitudinal direction z. Each of the channel regions may adjoin two neighboring trench gate structures 102. A respective shielding region 124 may be positioned between neighboring channel regions in the longitudinal directions z. The shielding regions 124 and the channel regions (e.g., the body regions 108) may have a checkerboard-like structure in the plan view.

While the cut along the upper position B-B', shown on the left hand side of FIG. 7B, may be identical for the embodiments shown in FIGS. 7B and 7C, the two embodiments may differ by the cut along the lower position C-C' (right hand side of FIG. 7B).

In the embodiment shown in FIG. 7B, the first regions 112 adjoin only one of the two neighboring trench gate structures 102. The channel region thus has an asymmetrical structure. In this embodiment, the channel of the semiconductor device 100 may be formed only at a portion of the sidewall of the trench gate structure 102 that is adjoined by a first region 112.

In the embodiment shown in FIG. 7C, the first regions 112 adjoin both of the two neighboring trench gate structures 102. The channel region thus has a symmetrical structure. In this embodiment, the channel of the semiconductor device 100 may be formed at both sidewalls of the trench gate structure 102.

The checkerboard-like structure shown in FIGS. 7B and 7C may be combined with other embodiments described herein, either for the asymmetrical channel region (right hand side of FIG. 7B) or the symmetrical channel region (FIG. 7C). For example, at least one of the compensation region 114, the second region 116 and the third region 118 may adjoin both sidewalls of neighboring trench gate structures 102, similar to the embodiment shown in connection with FIG. 7C.

In general, each of the respective doping regions comprised by the channel region may have a similar doping profile along at least 60% (or at least 80%) of the extent of said doping region and/or the channel region in the longitudinal direction. In addition or as an alternative, each of the respective doping regions comprised by the channel region may have a similar doping profile along at least 60% (or at least 80%) of the extent of said doping region in the lateral direction perpendicular to the longitudinal direction. In this context, "similar" includes deviations of up to ±15% or ±10% from an average.

Functional and structural details described with respect to the embodiments above shall likewise apply to the exemplary embodiments illustrated in FIGS. 5, 6A, 6B, 7A, 7B and/or 7C and vice versa.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a trench gate structure extending from a first surface into a silicon carbide semiconductor body along a vertical direction; and
a body region of a first conductivity type adjoining a sidewall of the trench gate structure, the body region including a first body sub-region adjoining the sidewall and a second body sub-region adjoining the sidewall,
wherein at least one profile of dopants of the first conductivity type along the vertical direction includes a first doping peak in the first body sub-region and a second doping peak in the second body sub-region,
wherein a doping concentration of the first doping peak is larger than a doping concentration of the second doping peak,
wherein the body region further comprises a third body sub-region between the first body sub-region and the second body sub-region,
wherein at least one profile of dopants of the first conductivity type along the vertical direction includes a third doping peak in the third body sub-region,
wherein a doping concentration of the third doping peak is smaller than the doping concentration of the first doping peak and also smaller than the doping concentration of the second doping peak.

2. The semiconductor device of claim 1, wherein a partial compensation of dopants of the first conductivity type by dopants of a second conductivity type ranges between 10% to 95% in at least part of the third body sub-region.

3. The semiconductor device of claim 1, wherein the trench gate structure comprises a gate dielectric and a gate electrode, and wherein a material of the gate electrode is at least one of highly p-doped polycrystalline silicon, nickel, platinum, gold, and selenium.

4. The semiconductor device of claim 1, wherein the trench gate structure comprises a gate dielectric and a gate electrode, and wherein a work function of a material of the gate electrode ranges between 4 eV to 6.5 eV.

5. The semiconductor device of claim 1, further comprising:
a shielding region of the first conductivity type adjoining at least part of a bottom of the trench gate structure.

6. The semiconductor device of claim 1, wherein the body region adjoins a second sidewall of the trench gate structure opposite to the sidewall.

7. The semiconductor device of claim 1, wherein the body region adjoins only one sidewall of two opposing sidewalls of the trench gate structure.

8. A semiconductor device, comprising:
a trench gate structure extending from a first surface into a silicon carbide semiconductor body along a vertical direction; and
a body region of a first conductivity type adjoining a sidewall of the trench gate structure, the body region including a first body sub-region adjoining the sidewall and a second body sub-region adjoining the sidewall,
wherein at least one profile of dopants of the first conductivity type along the vertical direction includes a first doping peak in the first body sub-region and a second doping peak in the second body sub-region,
wherein a doping concentration of the first doping peak is larger than a doping concentration of the second doping peak,
wherein the body region further comprises a third body sub-region between the first body sub-region and the second body sub-region,
wherein at least one profile of dopants of the first conductivity type along the vertical direction includes a doping valley in the third body sub-region.

9. The semiconductor device of claim 8, wherein the third body sub-region adjoins the sidewall of the trench gate structure.

10. The semiconductor device of claim 8, wherein a partial compensation of dopants of the first conductivity type by dopants of a second conductivity type ranges between 10% to 95% in at least part of the third body sub-region.

11. A semiconductor device, comprising:
a trench gate structure extending from a first surface into a silicon carbide semiconductor body along a vertical direction;
a body region of a first conductivity type adjoining a sidewall of the trench gate structure, the body region including a first body sub-region adjoining the sidewall and a second body sub-region adjoining the sidewall; and
a first region of a second conductivity type opposite the first conductivity type between the first body sub-region and the second body sub-region,
wherein at least one profile of dopants of the first conductivity type along the vertical direction includes a first doping peak in the first body sub-region and a second doping peak in the second body sub-region,
wherein a doping concentration of the first doping peak is larger than a doping concentration of the second doping peak,
wherein the first region adjoins at least one of the first body sub-region and the second body sub-region.

12. The semiconductor device of claim 11, wherein the first region adjoins the sidewall of the trench gate structure.

13. The semiconductor device of claim 11, wherein the first region is arranged at a lateral distance from the sidewall of the trench gate structure, wherein the body region comprises a fourth body sub-region, wherein the fourth body sub-region is arranged between the first region and the sidewall, and wherein the first region and the fourth body sub-region adjoin each other.

14. The semiconductor device of claim 11, wherein a dimension of the first region along a lateral direction ranges from 20 nm to 200 nm.

15. The semiconductor device of claim 11, wherein a doping concentration of the first region averaged along the lateral direction ranges from $5 \times 10^{15}$ cm$^{-3}$ to $2 \times 10^{17}$ cm$^{-3}$.

16. The semiconductor device of claim 11, further comprising:
 a compensation region of the first conductivity type,
 wherein along the lateral direction, the first region is arranged between the sidewall and the compensation region or the compensation region is arranged between the sidewall and the first region.

17. The semiconductor device of claim 16, wherein a doping concentration of the compensation region averaged along a lateral dimension in the lateral direction times the lateral dimension differs by at most ±20% from a doping concentration of the first region averaged along a lateral dimension in the lateral direction times the lateral dimension.

18. The semiconductor device of claim 16, wherein the compensation region is arranged between the sidewall and the first region, and wherein the semiconductor device further comprises:
 a second region of the second conductivity type arranged between the first region and the sidewall, the second region adjoining the sidewall and the first body sub-region, a vertical dimension of the second region being smaller than a vertical dimension of the first region; and/or
 a third region of the second conductivity type arranged between the first region and the sidewall, the third region adjoining the sidewall and the second body sub-region, a vertical dimension of the third region being smaller than a vertical dimension of the first region.

* * * * *